(12) United States Patent
Cheng et al.

(10) Patent No.: US 7,535,045 B2
(45) Date of Patent: May 19, 2009

(54) CHECKERBOARD DEEP TRENCH DYNAMIC RANDOM ACCESS MEMORY CELL ARRAY LAYOUT

(75) Inventors: Chien-Li Cheng, Hsin-Chu (TW); Chin-Tien Yang, Kaohsiung County (TW); Tzung-Han Lee, Taipei (TW); Shian-Hau Liao, Tai-Chung (TW); Chung-Yuan Lee, Tao-Yuan (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 7 days.

(21) Appl. No.: 11/776,558

(22) Filed: Jul. 12, 2007

(65) Prior Publication Data

US 2008/0251827 A1    Oct. 16, 2008

(30) Foreign Application Priority Data

Apr. 10, 2007    (TW)    ............................... 96112466 A

(51) Int. Cl.
 *H01L 27/108*    (2006.01)
(52) U.S. Cl. ........................... 257/301; 257/68; 257/71; 257/905; 257/906; 257/E27.084; 257/E21.646; 438/210

(58) Field of Classification Search ................. 257/68, 257/71, 905, 906, 907, 908, E27.084, E21.646, 257/301; 438/210
See application file for complete search history.

(56) References Cited

U.S. PATENT DOCUMENTS

2005/0026363 A1*    2/2005    Cheng et al. ................. 438/257

* cited by examiner

*Primary Examiner*—Sue Purvis
*Assistant Examiner*—Tucker Wright
(74) *Attorney, Agent, or Firm*—Winston Hsu

(57) ABSTRACT

A checkerboard deep trench dynamic random access memory cell array layout is disclosed, which includes a substrate, a plurality of gate conductor lines disposed on the substrate, a plurality of checkerboard-arranged and staggered deep trench capacitor structures embedded in the substrate under the gate conductor lines, and a plurality of active areas formed in the substrate under the gate conductor lines, alternatively arranged with the deep trench capacitor structures, and electrically connected with an adjacent deep trench capacitor structure. The width of the parts of the gate conductor lines above the deep trench capacitor structures is narrower than that of the parts of the gate conductor lines above the active areas.

5 Claims, 6 Drawing Sheets

CHECKERBOARD DEEP TRENCH DYNAMIC RANDOM ACCESS MEMORY CELL ARRAY LAYOUT

BACKGROUND OF THE INVENTION

1. Field of the Invention

The present invention relates to a dynamic random access memory (DRAM), and particularly to a checkerboard deep trench DRAM cell array layout.

2. Description of the Prior Art

As various consumer electronic products are constantly miniaturized, the size of the semiconductor devices also shrinks to be in accordance with product demands and the trends of high integration, high performance, and low power consumption. Taking the double data rate-synchronous dynamic random access memory (DDR-DRAM) for an example, deep trench capacitor structures are widely utilized for a high density DRAM layout to improve integration.

Please refer to FIGS. 1 and 2. FIG. 1 is a schematic diagram showing a conventional checkerboard deep trench DRAM cell array layout. FIG. 2 is a schematic cross-sectional view taken along line I-I' of FIG. 1, and further shows bit lines (hereinafter referred to as "BL"). The conventional checkerboard deep trench DRAM cell array 10 is characterized that the deep trench capacitors 11 in the memory cell array are arranged staggeredly in a checkerboard type. The bit lines (BL, shown in FIG. 2 but not in FIG. 1) orthogonally overlie the gate conductor lines (GC). Each deep trench capacitor 11 includes a single side buried strap (SSBS), as shown in FIG. 2. Each bit line is electrically connected to a source/drain region of a corresponding cell select transistor through a bit line contact (hereinafter referred to as "CB") 12 on active areas 17.

In the conventional checkerboard deep trench DRAM cell array, all of the gate conductor lines are straight lines with a same width. Thus, under consideration to the limitation of the feature size of the manufacturing process, when the line width of the gate conductor lines and the distance between two adjacent gate conductor lines are designed to be as small as 1 feature size, the CB landing area between two gate conductor lines will be too narrow with respect to 60 nm or sub-60 nm manufacturing processes, and accordingly the process window of the dry etching will be small in a CB manufacturing process. This will cause a contact open issue, and CB tends to be damaged. If the transistor structure includes a recess gate channel structure, it is also affected by the minimized size.

The conventional layout structure includes components with respective sizes. For example, when the memory cell array is manufactured in 1 feature size (F), the line width of the gate conductor lines is 1 F, and the distance between two adjacent gate conductor lines is 1 F. Generally, the deep trench capacitors shift in a distance of 0.1 F toward one side of the gate conductor lines, and, as a result, the width B is 0.75 F, and the width C is 0.95 F. The spacers (not shown), which are typically disposed on the sidewalls of the gate conductor lines, generally have a thickness of 15 nm. In case 1 F equals 50 nm, the spacer has already occupied 0.3 F of 1 F. Thus, when the active areas with the width C, which is wider than the width B, are used as the areas for bit line contact, the width for the nominal landing area remains only in 0.35 F, which equals to 17.5 nm and is too narrow.

Such checkerboard deep trench DRAM cell array has a layout with narrow bit line contact areas in the 60 nm or sub-60 nm manufacturing process, such that the aspect ratio will be too high and the manufacture is not easy. Accordingly, when the contact hole is filled with conductive material, contact open issue tends to occur and the electric properties of the devices will be affected.

FIG. 3 shows another conventional deep trench DRAM cell array, a MINT (merged isolation and node trench) cell DRAM cell array using a low power. In the MINT cell DRAM cell array 20, deep trench capacitors 13 are disposed under passing word lines 15. Transistors 14 are electrically connected to storage nodes 16 of deep trench capacitors 13 through active areas 18. Active areas 19 are also included, which are electrically connected to contacts 22. Contacts 22 connect to bit lines (not shown) to read and write to storage nodes 16 through transistors 14. A wiggled word line layout has been proposed to increase the area of the bit line contact, as shown in FIG. 4. However, the photo process in manufacturing processes for such layout is difficult to carry out.

Therefore, there is still a need for a checkerboard deep trench DRAM cell array layout having high integration but without the aforesaid problems.

SUMMARY OF THE INVENTION

One objective of the present invention is to provide a checkerboard deep trench DRAM cell array layout, which has a relatively wide contact landing area for bit lines.

The checkerboard deep trench DRAM cell array layout according to the present invention comprises a substrate; a plurality of gate conductor lines disposed on the substrate; a plurality of checkerboard-arranged deep trench capacitor structures embedded in the substrate under the gate conductor lines, wherein the deep trench capacitor structures under any two adjacent gate conductor lines are staggered; and a plurality of active areas formed in the substrate under the gate conductor lines, alternatively arranged with the deep trench capacitor structures, and electrically connected with an adjacent deep trench capacitor structure. The width of the parts of the gate conductor lines above the deep trench capacitor structures is narrower than the width of the parts of the gate conductor lines above the active areas.

The checkerboard deep trench DRAM cell array layout according to the present invention has an increased area for bit line contact landing on active areas because the width of the parts of the gate conductor lines above the deep trench capacitor structures is narrower than that of the parts of the gate conductor lines above the active areas. Therefore, the manufacturing process may be well performed to avoid the contact open issue. In addition, since the gate channel of the transistor still has an enough length, the contact open issue also can be avoided in a hole type recess channel using such layout.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
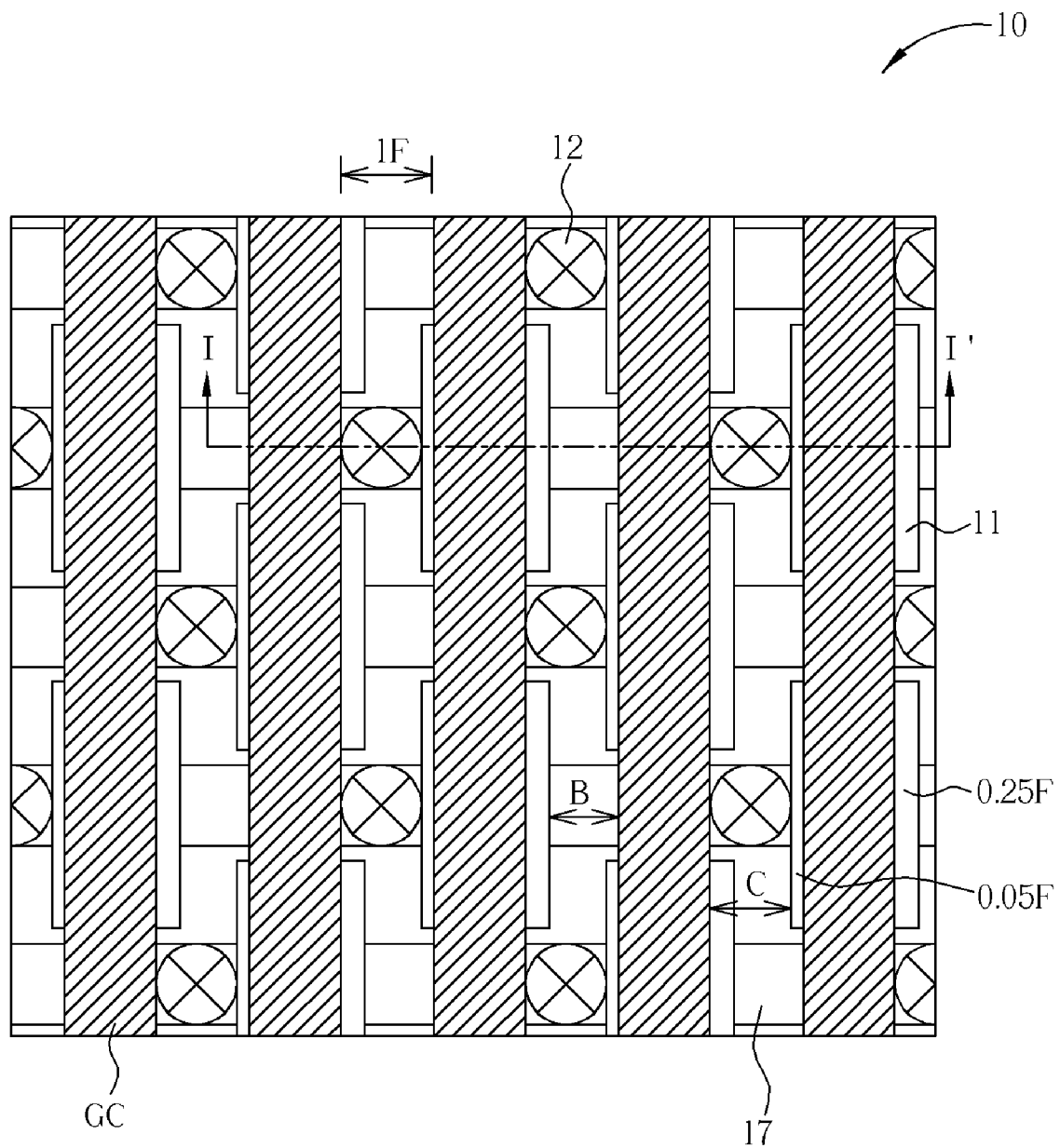
FIG. 1 is a schematic diagram showing a conventional checkerboard deep trench DRAM cell array layout.
Figure 2:
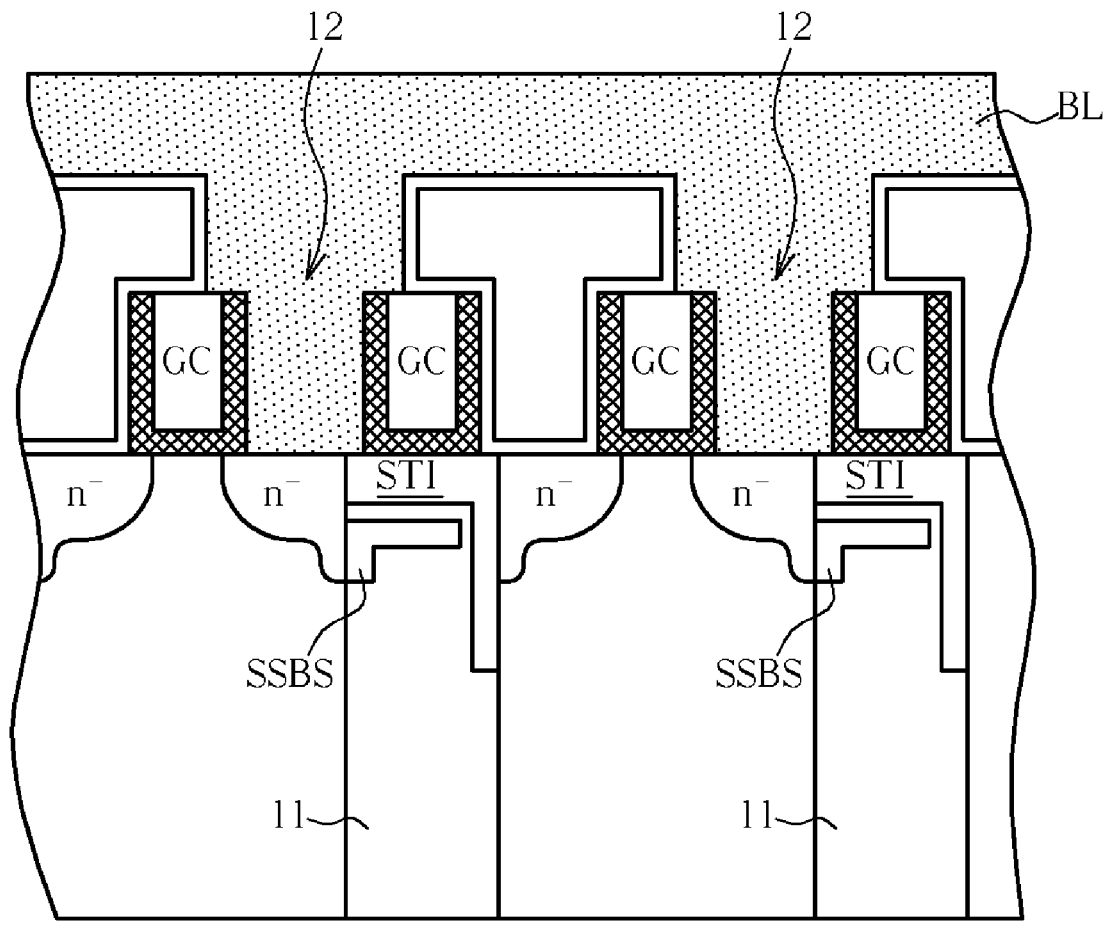
FIG. 2 is a schematic cross-sectional view taken along line I-I' of FIG. 1.
Figure 3:
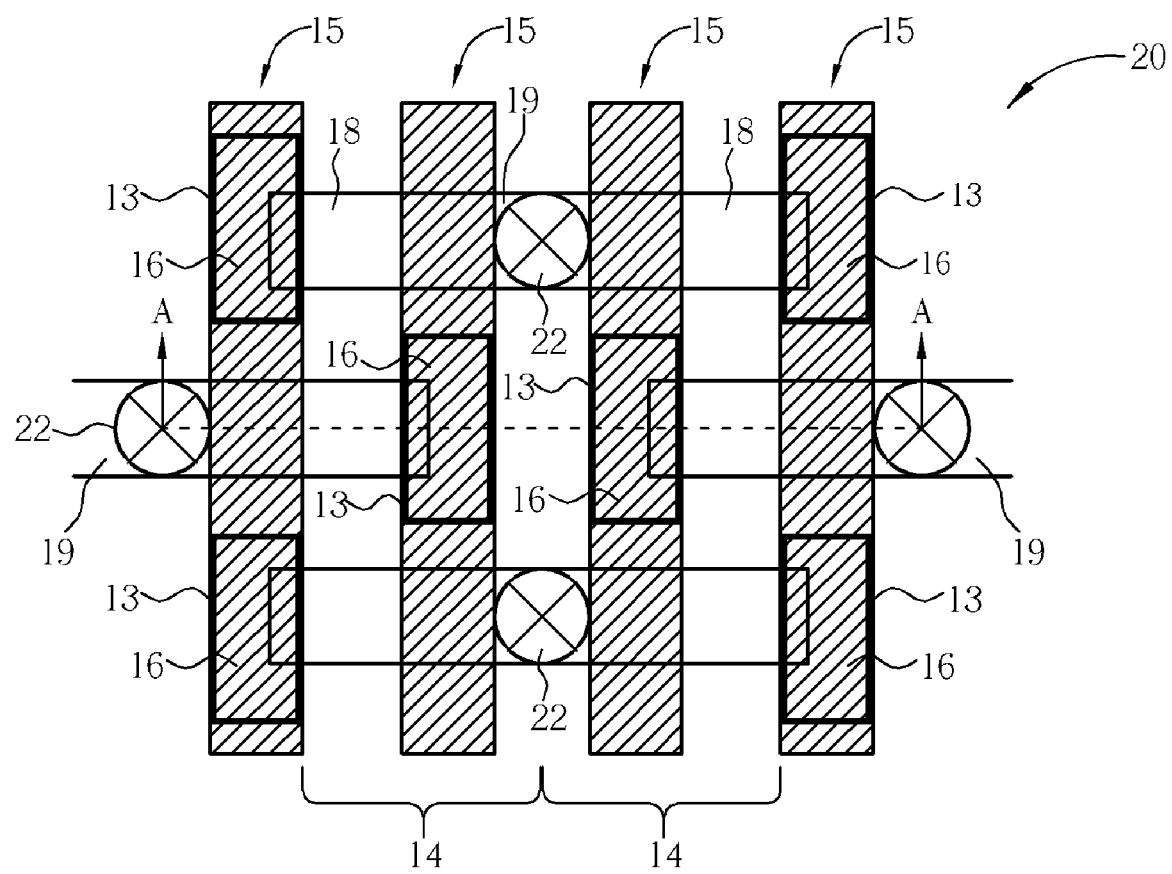
FIG. 3 is a schematic diagram showing a conventional MINT cell deep trench DRAM cell array layout.
Figure 4:
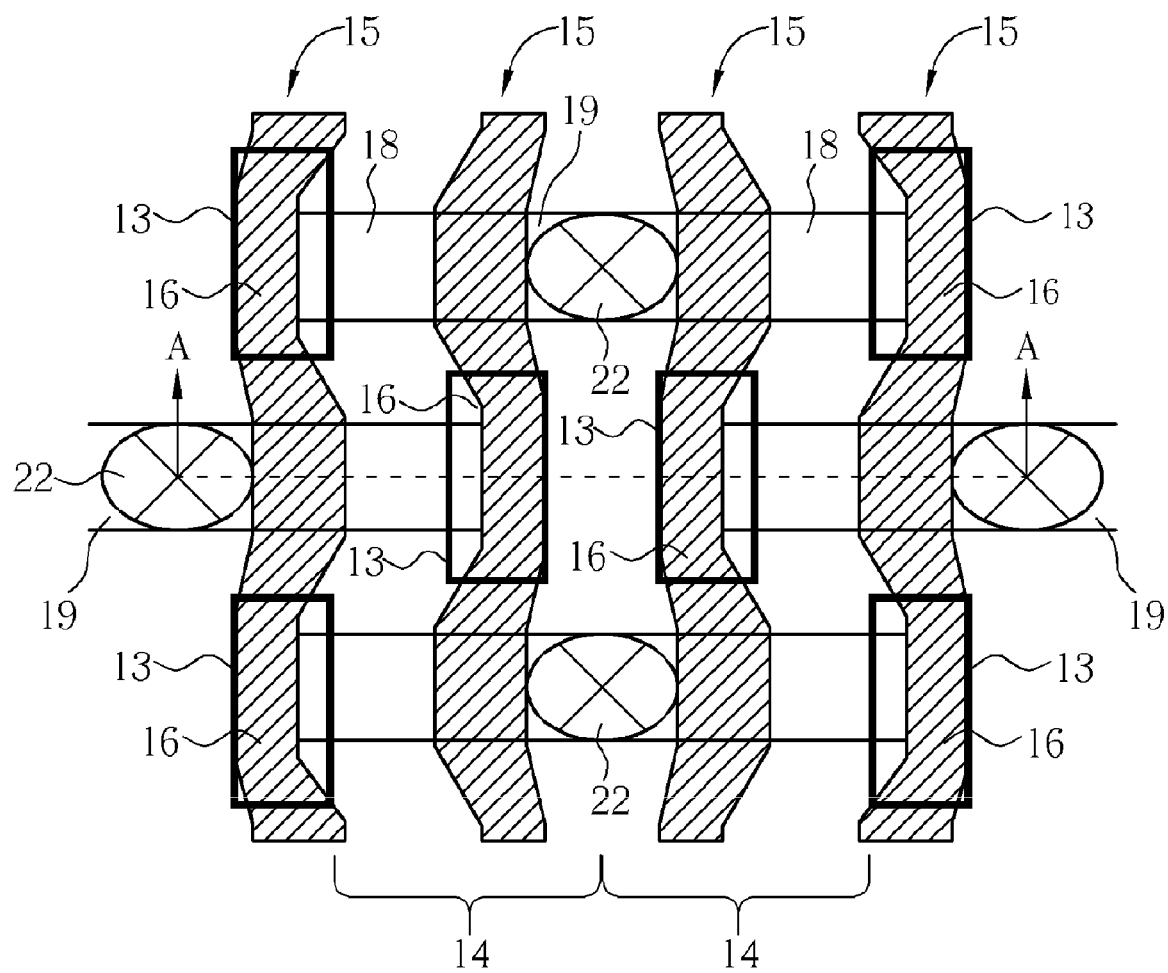
FIG. 4 is a schematic diagram showing a conventional MINT cell deep trench DRAM cell array layout having wiggled bit lines.
Figure 5:
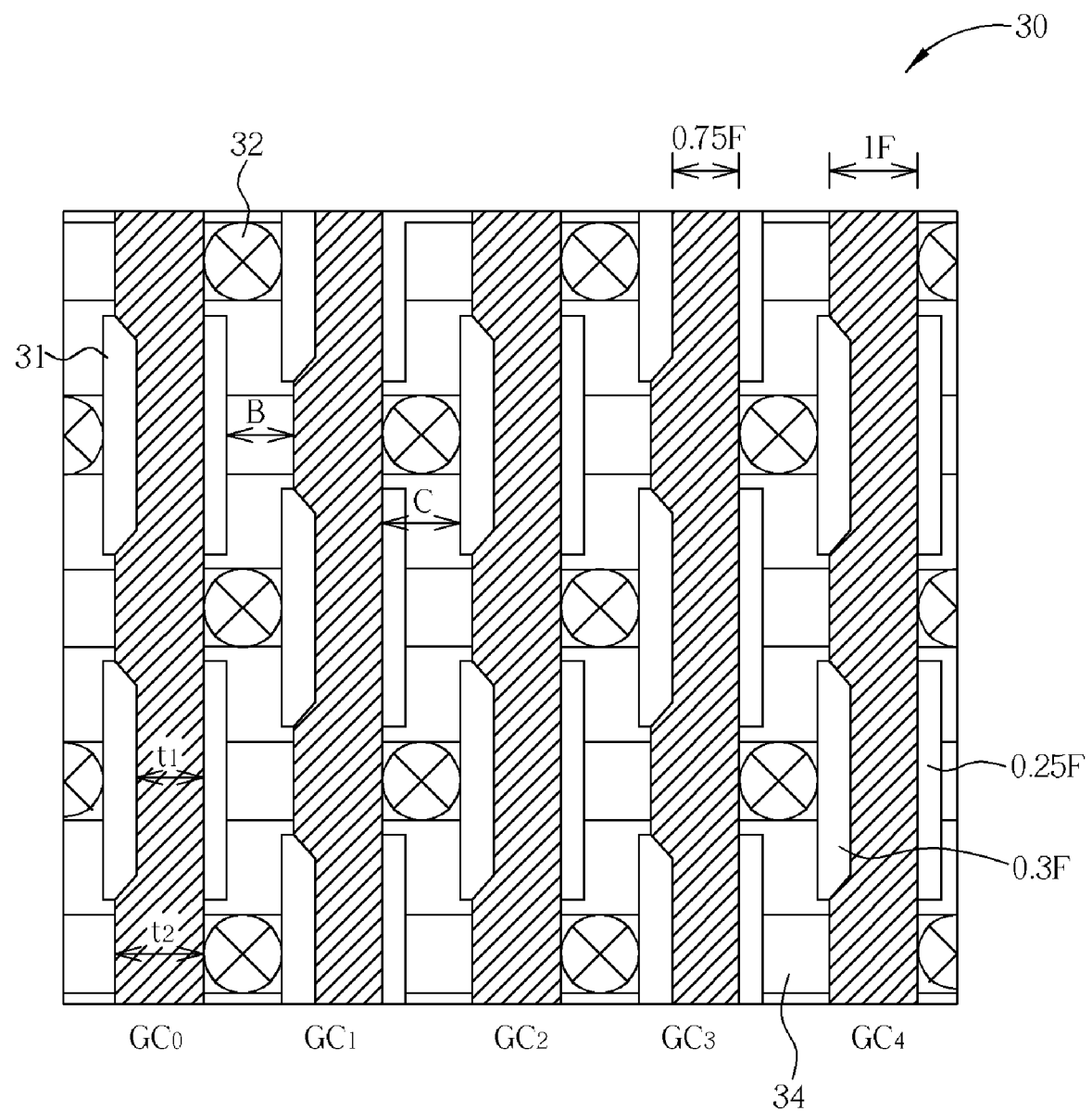
FIG. 5 shows a checkerboard deep trench DRAM cell array layout embodiment according to the present invention.

Hereinafter, some embodiments are described to illustrate the checkerboard deep trench DRAM cell array layout according to the present invention. Please refer to FIG. 5 showing a checkerboard deep trench DRAM cell array layout embodiment according to the present invention. The checkerboard deep trench DRAM cell array 30 comprises a substrate; a plurality of gate conductor lines $GC_0$, $GC_1$, $GC_2$, $GC_3$, $GC_4$, disposed on the substrate. A plurality of checkerboard-arranged deep trench capacitor structures 31 are embedded in the substrate under the gate conductor lines. The deep trench capacitor structures 31 under any two adjacent gate conductor lines are staggered orderly. For example, with respect to the gate conductor lines $GC_1$ and $GC_2$, the deep trench capacitor structure under the gate conductor line $GC_1$ and the deep trench capacitor structure under the gate conductor line $GC_2$ are staggered in a checkerboard pattern. A plurality of active areas 34 are formed in the substrate under the gate conductor lines $GC_0$, $GC_1$, $GC_2$, $GC_3$, $GC_4$ and alternatively arranged with the deep trench capacitor structures 31. The active areas 34 are those at the sides of the gate conductor lines to serve as source/drain regions and electrically connected with an adjacent deep trench capacitor structure, for transferring electric signals. One characterization of the checkerboard deep trench DRAM cell array layout according to the present invention is that the width (for example, $t_1$) of the parts of the gate conductor lines above the deep trench capacitor structures 31 is narrower than the width (for example, $t_2$) of the parts of the gate conductor lines above the active areas 34. The reduced amount of the width is not particularly limited as long as the gate conductor lines do not break during the manufacturing process due to the reduction of the width, for sustaining the function of electric signal transferring. For example, the parts of the gate conductor lines above the deep trench capacitor structures 31 may be reduced at one side and the width becomes 0.6 F. In this embodiment, all the parts of the gate conductor lines above the deep trench capacitor structures 31 are reduced at the same side, and accordingly the entire gate conductor line has a wiggled appearance at one side, while a straight appearance at the other side. Therefore, the width of the contact landing areas can be increased. Furthermore, since the width of the gate conductor lines above the active areas is maintained in the required width, the electric properties of the memory cell devices will not be affected by the decrease of the width.

For example, as shown in FIG. 5, in such special layout of the present invention, when the memory cell array is made in accordance with one feature size, the line width of the gate conductor line is 1 F, the distance between two adjacent gate conductor lines is 1 F, and the deep trench capacitors shift toward one side of the gate conductor lines in 0.1 F. In addition, the parts of the gate conductor lines above the deep trench capacitors are reduced at one side to have a width of, for example, 0.75 F, such that the width B shown in FIG. 5 will be 0.75 F, the width C will be 0.95 F, the width of deep trench capacitor regions exposed at one side of the gate conductor lines can be 0.3 F, and that at the other side can be 0.25 F. Spacers (not shown) are typically disposed on the sidewalls of the gate conductor lines, with a general thickness of 15 nm. Thus, in case 1 F is equivalent to 50 nm, the spacer has already occupied 0.3 F. When the area with the width C is used as the area for the bit line contact 32, the width for the nominal landing area remains in 0.65 F after deducting the thickness, 0.3 F, of the spacer at one side. The width of the nominal landing area does not need to be deducted at the other side and thus is still 0.65 F, because the parts of the gate conductor lines above the deep trench capacitors 31 are narrower and the spacers with a thickness of 0.3 F only cover the top of the deep trench capacitors but not the active area with the width C. 0.65 F is equivalent to 32.5 nm, and the area for the bit line contact 32 is spacious. Therefore, the memory cell array of the present invention may have a high integration. It should be noted that the sizes described above are for illustration purpose only, and the sizes useful in the present invention are not limited thereto.

Figure 6:
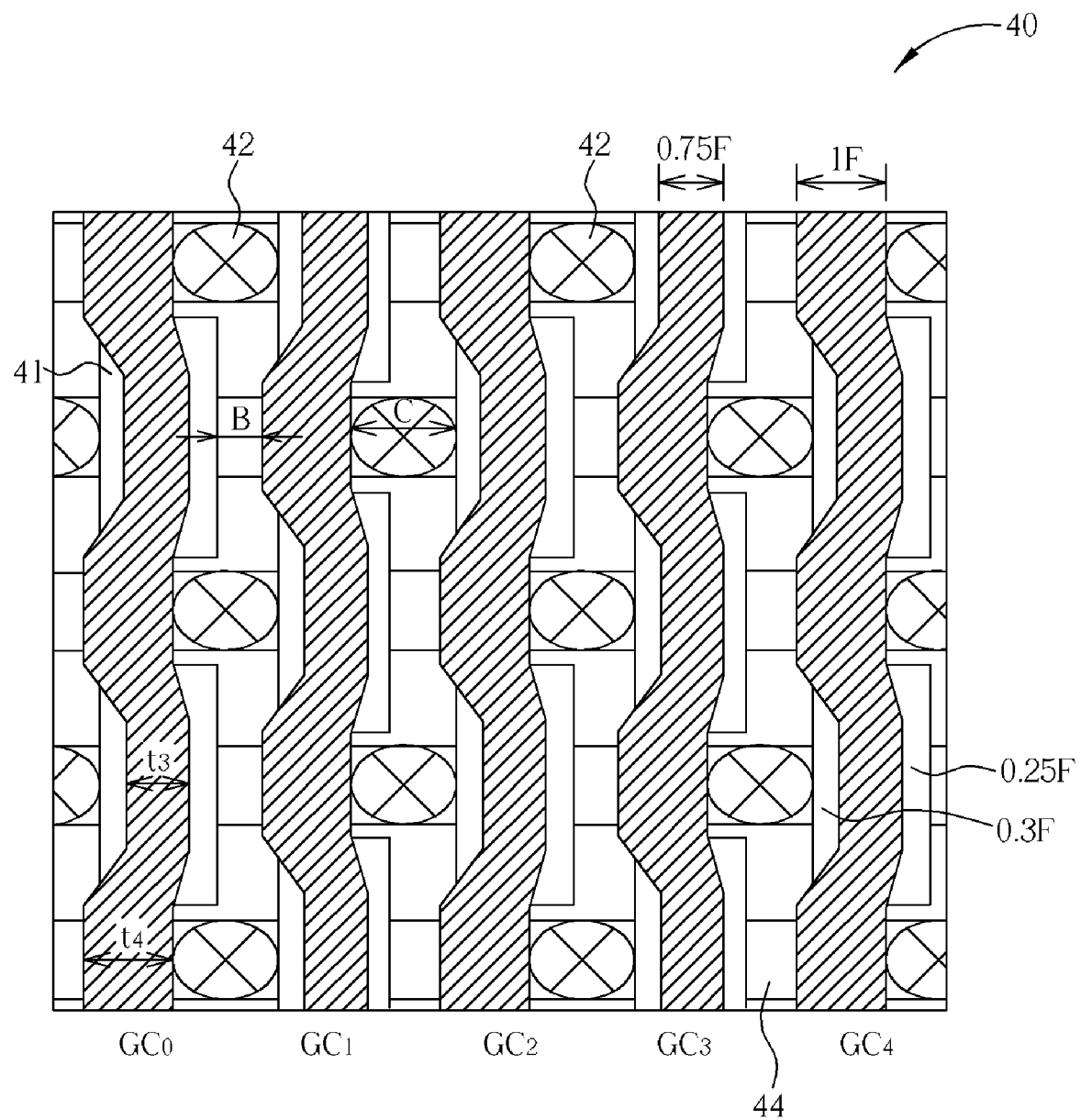
FIG. 6 shows another checkerboard deep trench DRAM cell array layout embodiment according to the present invention.

Please refer to FIG. 6 showing another checkerboard deep trench DRAM cell array layout embodiment according to the present invention. The checkerboard deep trench DRAM cell array layout 40 has a similar layout to the aforesaid checkerboard deep trench DRAM cell array layout 30, in which, the width (for example, $t_3$) of the parts of the gate conductor lines above the deep trench capacitor structures 41 is narrower than the width (for example, $t_4$) of the parts of the gate conductor lines above the active areas 44, and, in addition, the parts of the gate conductor lines above the active areas 44 further shift toward one side, such that the gate conductor lines, which would be designed as being straight in a case of a conventional checkerboard deep trench DRAM cell array layout, are wiggled in the present invention. That is, in this embodiment, since some parts of the gate conductor lines are narrower and other parts of the gate conductor lines further shift, both sides of the gate conductor lines have a wiggled appearance. Accordingly, the width C may be increased, such that the area for the bit line contact 42 is more spacious. The distance of the shifting is not particularly limited as long as the manufacture of the adjacent gate conductor lines or deep trench capacitor structures is not affected. The distance of the shifting may be, for example, 0.7 F, but not limited thereto.

Still as shown in FIG. 6, for example, when the memory cell array is made in accordance with one feature size, the line width of the gate conductor line is 1 F, the distance between two adjacent gate conductor lines is 1 F, and the deep trench capacitors are disposed as to shift toward one side of the gate conductor lines in 0.1 F. In addition, the width of the parts of the gate conductor lines above the deep trench capacitors are reduced at one side to become, for example, 0.75 F, and the parts of the gate conductor lines above the active areas shift toward one side, for example, in a distance of 0.25 F, such that the width B shown in FIG. 6 will be 0.5 F, the width C will be 1.2 F, the width of deep trench capacitor regions exposed at one side of the gate conductor lines can be 0.3 F, and that at the other side can be 0.25 F. Spacers (not shown) are typically disposed on the sidewalls of the gate conductor lines, with a general thickness of 15 nm. Thus, in case 1 F is equivalent to 50 nm, the spacer has already occupied 0.3 F. When the area with the width C is used as the area for the bit line contact, the width for the nominal landing area remains in 0.9 F after deducting the thickness, 0.3 F, of the spacer at one side. The width of the nominal landing area does not need to be deducted at the other side and thus is still 0.9 F, because the parts of the gate conductor lines above the deep trench capacitors 41 are narrower and the spacers with a thickness of 0.3 F only cover the top of the deep trench capacitors but not the active area with the width C. 0.9 F is equivalent to 45 nm, and it is very spacious. It should be noted that the sizes described above is for illustration purpose only, and the sizes useful in the present invention is not limited thereto.

In the checkerboard deep trench DRAM cell array layout according to the present invention, the deep trench capacitors, the transistors, and the like are known structure and can be made using conventional techniques. The isolation structures among memory cells are also as those in the conventional techniques. In the present invention, the transistors may have a planar gate channel or a recess gate channel. The hole type recess gate channel still can be easily made without contact open issues, because the width of the parts of the gate conductor lines above the active areas, which serve as the gates of the transistors, is still maintained in 1 F, in the 60 nm or sub-60 nm manufacturing processes of the checkerboard deep trench DRAM cell array layout of the present invention.

Those skilled in the art will readily observe that numerous modifications and alterations of the device and method may be made while retaining the teachings of the invention.

What is claimed is:

1. A checkerboard deep trench dynamic random access memory cell array layout, comprising:
    a substrate;
    a plurality of gate conductor lines disposed on the substrate;
    a plurality of checkerboard-arranged deep trench capacitor structures embedded in the substrate under the gate conductor lines, wherein the deep trench capacitor structures under any two adjacent gate conductor lines are staggered; and
    a plurality of active areas formed in the substrate under the gate conductor lines, alternatively arranged with the deep trench capacitor structures, and electrically connected with an adjacent deep trench capacitor structure,
    wherein all of the parts of the gate conductor lines above the deep trench capacitor structures are reduced on a same side, such that the width of the parts of the gate conductor lines above the deep trench capacitor structures is narrower than the width of the parts of the gate conductor lines above the active areas.

2. The checkerboard deep trench dynamic random access memory cell array layout of claim 1, wherein the parts of the gate conductor lines above the active areas shift toward one side, such that the gate conductor lines are wiggled.

3. The checkerboard deep trench dynamic random access memory cell array layout of claim 1, wherein the gate conductor lines have a width of 1 feature size (F) and the parts of the gate conductor lines above the deep trench capacitor structures have a width less than 1 feature size (F).

4. A checkerboard deep trench dynamic random access memory cell array layout, comprising:
    a substrate;
    a plurality of gate conductor lines disposed on the substrate;
    a plurality of checkerboard-arranged deep trench capacitor structures embedded in the substrate under the gate conductor lines, wherein the deep trench capacitor structures under any two adjacent gate conductor lines are staggered; and
    a plurality of active areas formed in the substrate under the gate conductor lines, alternatively arranged with the deep trench capacitor structures, and electrically connected with an adjacent deep trench capacitor structure,
    wherein the width of the parts of the gate conductor lines above the deep trench capacitor structures is narrower than the width of the parts of the gate conductor lines above the active areas, and
    all of the parts of the gate conductor lines above the active areas shift toward a same side, such that the gate conductor lines are wiggled.

5. A checkerboard deep trench dynamic random access memory cell array layout, comprising:
    a substrate;
    a plurality of gate conductor lines disposed on the substrate;
    a plurality of checkerboard-arranged deep trench capacitor structures embedded in the substrate under the gate conductor lines, wherein the deep trench capacitor structures under any two adjacent gate conductor lines are staggered; and
    a plurality of active areas formed in the substrate under the gate conductor lines, alternatively arranged with the deep trench capacitor structures, and electrically connected with an adjacent deep trench capacitor structure,
    wherein the parts of the gate conductor lines above the deep trench capacitor structures are reduced on one side, such that the width of the parts of the gate conductor lines above the deep trench capacitor structures is narrower than the width of the parts of the gate conductor lines above the active areas, and
    all of the parts of the gate conductor lines above the active areas shift toward a same side, such that the gate conductor lines are wiggled.

* * * * *